(12) United States Patent
Sun et al.

(10) Patent No.: US 12,250,843 B2
(45) Date of Patent: Mar. 11, 2025

(54) TRANSPARENT DISPLAY DEVICE, SIMULATION METHOD, AND MANUFACTURING METHOD

(71) Applicant: BOE Technology Group Co., Ltd., Beijing (CN)

(72) Inventors: Xuefei Sun, Beijing (CN); Jaegeon You, Beijing (CN); Xing Zhang, Beijing (CN); Yicheng Lin, Beijing (CN); Pan Xu, Beijing (CN); Ying Han, Beijing (CN); Guoying Wang, Beijing (CN); Zhan Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 441 days.

(21) Appl. No.: 17/761,537

(22) PCT Filed: May 20, 2021

(86) PCT No.: PCT/CN2021/094908
§ 371 (c)(1),
(2) Date: Mar. 17, 2022

(87) PCT Pub. No.: WO2021/233384
PCT Pub. Date: Nov. 25, 2021

(65) Prior Publication Data
US 2022/0384763 A1    Dec. 1, 2022

(30) Foreign Application Priority Data

May 20, 2020   (CN) .................... 202010429759.7

(51) Int. Cl.
*H10K 50/854*   (2023.01)
*H10K 71/00*   (2023.01)
*H10K 59/12*   (2023.01)

(52) U.S. Cl.
CPC .......... *H10K 50/854* (2023.02); *H10K 71/00* (2023.02); *H10K 59/12* (2023.02); *H10K 59/1201* (2023.02)

(58) Field of Classification Search
CPC ...... H10K 50/854; H10K 71/00; H10K 59/12; H10K 59/1201; H10K 59/877; G06F 30/20
See application file for complete search history.

(56) References Cited

U.S. PATENT DOCUMENTS

2015/0084022 A1\* 3/2015 Koshihara ............ H10K 59/122
257/40
2015/0194634 A1   7/2015 Kang et al.
(Continued)

FOREIGN PATENT DOCUMENTS

| CN | 103533260 A | 1/2014 |
| CN | 103633109 A | 3/2014 |

(Continued)

OTHER PUBLICATIONS

CN 202010429759.7 second office action.
(Continued)

*Primary Examiner* — Sitaramarao S Yechuri
(74) *Attorney, Agent, or Firm* — IPro, PLLC

(57) ABSTRACT

The present disclosure provides a transparent display device, a simulation method, and a manufacturing method. The transparent display device includes a base substrate and a plurality of pixels arranged in an array form on the base substrate. Each pixel includes a transparent region and a display region, and a scattering structure for scattering light is arranged along a boundary between the transparent region and the display region.

14 Claims, 5 Drawing Sheets

(56) References Cited

U.S. PATENT DOCUMENTS

| | | | |
|---|---|---|---|
| 2016/0248038 A1* | 8/2016 | Philippens | H10K 59/80518 |
| 2016/0293894 A1* | 10/2016 | Cheng | H10K 59/35 |
| 2017/0168342 A1 | 6/2017 | Park et al. | |
| 2020/0350361 A1* | 11/2020 | Tao | G09G 3/32 |

FOREIGN PATENT DOCUMENTS

| | | |
|---|---|---|
| CN | 106024835 A | 10/2016 |
| CN | 106855666 A | 6/2017 |
| CN | 110676296 A | 1/2020 |
| CN | 111584748 A | 8/2020 |

OTHER PUBLICATIONS

Song, Young W., et al. "11.3: Distinguished Paper: LTPSbased Transparent Am Oled." SID Symposium Digest of Technical Papers. vol. 41. No. 1. Oxford, UK: Blackwell Publishing Ltd, 2010.
CN 202010429759.7 first office action.
PCT/CN2021/094908 international search report and written opinion.

\* cited by examiner

TRANSPARENT DISPLAY DEVICE, SIMULATION METHOD, AND MANUFACTURING METHOD

CROSS-REFERENCE TO RELATED APPLICATIONS

This application is the U.S. national phase of PCT Application No. PCT/CN2021/094908 filed on May 20, 2021, which claims a priority to the Chinese Patent Application No. 202010429759.7 filed on May 20, 2020, the entire contents of which are hereby incorporated by reference.

TECHNICAL FIELD

The present disclosure relates to the field of display technology, in particular to a transparent display device, a simulation method, and a manufacturing method.

BACKGROUND

Large-size and high-Pixel Per Inch (PPI) transparent display has an excellent visual experience in various fields. At present, the demand for transparent display is increasing, especially in vehicles, smart homes, shop windows and the like. At the same time, through the development of transparent display technology, an application range of Organic Light-Emitting Diode (OLED) may be effectively expanded.

SUMMARY

In one aspect, the present disclosure provides in some embodiments a transparent display device, including a base substrate and a plurality of pixels arranged in an array form on the base substrate. Each pixel includes a transparent region and a display region, and a scattering structure for scattering light is arranged along a boundary between the transparent region and the display region.

In a possible embodiment of the present disclosure, the scattering structure includes a plurality of scattering point structures spaced apart from each other along the boundary between the transparent region and the display region.

In a possible embodiment of the present disclosure, the transparent display device further includes a scattering film layer on the base substrate, a plurality of scattering particle structures is distributed in the scattering film layer, and the plurality of scattering particle structures forms the plurality of the scattering point structures.

In a possible embodiment of the present disclosure, the scattering film layer includes an optical clear adhesive layer, and a plurality of scattering particles is distributed in the optical clear adhesive layer and forms the scattering particle structures.

In a possible embodiment of the present disclosure, the scattering film layer includes a transparent thin film layer having a surface in a discontinuous crystalline form, a discontinuous crystalline structure at the surface of the transparent thin film layer forms the scattering particle structure, and a refractive index of the transparent thin film layer is greater than a refractive index of the base substrate.

In a possible embodiment of the present disclosure, the scattering particles include quantum dot particles.

In a possible embodiment of the present disclosure, the transparent film layer includes an indium tin oxide thin film.

In a possible embodiment of the present disclosure, the transparent thin film layer has a thickness of 80 angstroms to 120 angstroms in a direction perpendicular to the base substrate.

In a possible embodiment of the present disclosure, a width of the scattering point structure in a direction perpendicular to the boundary and parallel to the base substrate is 0.5 micrometers to 1.0 micrometers.

In a possible embodiment of the present disclosure, a portion of an orthogonal projection of the scattering film layer onto the base substrate overlaps an orthogonal projection of the display region onto the base substrate, and the other portion of the orthogonal projection of the scattering film layer onto the base substrate overlaps an orthogonal projection of the transparent region onto the base substrate.

In a possible embodiment of the present disclosure, the orthogonal projection of the scattering film layer onto the base substrate completely overlaps the orthogonal projection of the display region onto the base substrate.

In a possible embodiment of the present disclosure, the display region is provided with a display unit, and the scattering film layer is provided between the display unit and the base substrate.

In a possible embodiment of the present disclosure, the display region is provided with a display unit, and the scattering film layer is provided on a side of the display unit away from the base substrate.

In a possible embodiment of the present disclosure, the display region is provided with a display unit including a plurality of film layers formed on the base substrate, and the scattering film layer is separately provided on an intermediate film layer of the display unit.

In a possible embodiment of the present disclosure, the display region is provided with a display unit including plurality of film layers formed on the base substrate, and the scattering film layer is arranged at a same layer and made of a same material as a light-transmitting film layer of the display unit.

In another aspect, the present disclosure provides in some embodiments a simulation method for determining a pixel structure of a transparent display device, including: establishing a simulation model, the simulation model including an original image generation member for displaying an original image, a pixel simulation member for simulating the pixel structure of the transparent display device, and a diffraction effect image generation member for displaying a diffraction effect image; adjusting a pixel structure parameter of the pixel simulation member in the simulation model so as to obtain diffraction effect images corresponding to the original image with different pixel structure parameters; determining a difference coefficient E of an image before and after the diffraction in accordance with the original image and the diffraction effect image, so as to obtain a correspondence between different pixel structure parameters and the difference coefficient E of the image before and after the diffraction as a quantitative evaluation result; and determining optimized pixel structure data of the transparent display device in accordance with the quantitative evaluation result.

In a possible embodiment of the present disclosure, the determining the difference coefficient E of the images before and after the diffraction in accordance with the original image and the diffraction effect image includes calculating the difference coefficient E through formulae: E1=an average brightness value of sub-pixels in the original image—an average brightness value of sub-pixels in the diffraction effect image (1), $E2=\overline{|E1|}+3*std2(E1)$ (2), $E3=(0.3*E21+0.6*E22+0.1*E23)*255$ (3), and $E=E3/E30$ (4), where $\overline{|E1|}$ is an average value of absolute values of E1, std2 (E1) is a mean square deviation of E1, each pixel includes a first sub-pixel, a second sub-pixel, and a third sub-pixel, E21, E22 and E23 are values of E2 obtained with respect to the first sub-pixel, the second sub-pixel and the third sub-pixel respectively, and E30 is a value of E3 calculated through formulae (1), (2) and (3) when the average brightness value of the sub-pixels in the diffraction effect image in formula (1) is zero.

In a possible embodiment of the present disclosure, the adjusting the pixel structure parameter of the pixel simulation member in the simulation model so as to obtain the diffraction effect images corresponding to the original image with different pixel structure parameters specifically includes adjusting the pixel structure parameter of the pixel simulation member in a single variable adjustment manner, and the pixel structure parameter at least includes a pixel aperture ratio parameter, a haze parameter, and a structural shape parameter of each of the transparent region and the display region in a pixel.

In yet another aspect, the present disclosure provides in some embodiments a method for manufacturing the above-mentioned transparent display device, including: forming a plurality of pixels arranged in an array form on the base substrate, each pixel including a transparent region and a display region; and forming a scattering structure for scattering light along a boundary between the transparent region and the display region.

In a possible embodiment of the present disclosure, prior to forming the plurality of pixels arranged in an array form on the base substrate, the method further includes determining optimized pixel structure data of the transparent display device through the above-mentioned simulation method, and the forming the plurality of pixels arranged in an array form on the base substrate includes forming the plurality of pixels arranged in an array form on the base substrate in accordance with the optimized pixel structure data.

In a possible embodiment of the present disclosure, the scattering structure includes a plurality of scattering point structures spaced apart from each other along the boundary between the transparent region and the display region, and the forming the scattering structure for scattering light along the boundary between the transparent region and the display region includes coating an optical clear adhesive layer doped with scattering particles on the base substrate, and patterning the optical clear adhesive layer to form the plurality of scattering point structures spaced apart from each other along the boundary between the transparent region and the display region.

In a possible embodiment of the present disclosure, the scattering structure includes a plurality of scattering point structures spaced apart from each other along the boundary between the transparent region and the display region. The forming the scattering structure for scattering light along the boundary between the transparent region and the display region includes depositing a transparent thin film on the base substrate, patterning the transparent thin film, and annealing the transparent thin film at a predetermined temperature to form a transparent thin film layer with a surface in a discontinuous crystalline form. A refractive index of the transparent thin film layer is greater than a refractive index of the base substrate, and a discontinuous crystalline structure in the transparent thin film layer forms the scattering point structure.

In a possible embodiment of the present disclosure, the scattering point structure includes quantum dot particles, and the display region includes a quantum dot light-emitting unit. The forming the scattering structure for scattering light along the boundary between the transparent region and the display region includes forming the optical clear adhesive layer and the quantum dot light-emitting unit simultaneously through a single patterning process.

DETAILED DESCRIPTION

Figure 1:
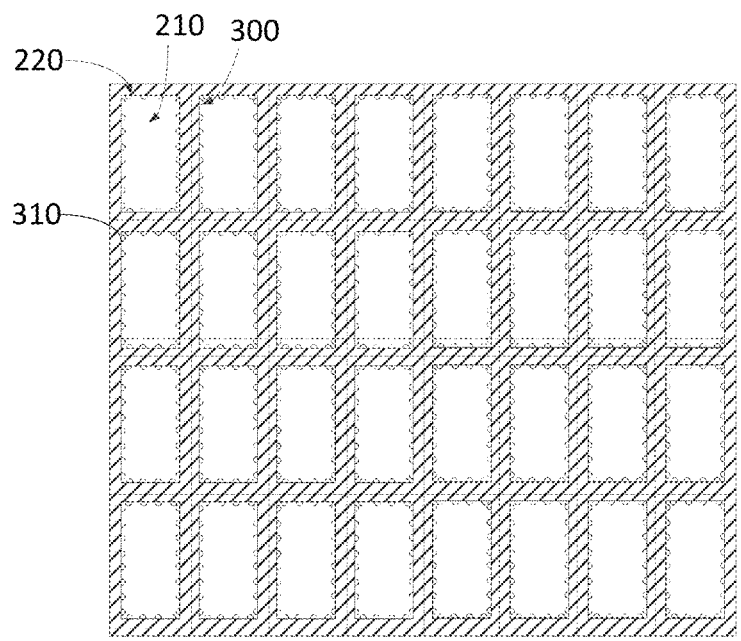
FIG. 1 is a top view of a transparent display device according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/ coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the related art, a PPI transparent display product is a small-size Low Temperature Polysilicon Light-Emitting Diode (LTPS-LED), a micro-LED, or a small-size oxide Organic Light-Emitting Diode (OLED). A large-size transparent display product usually has a low PPI. For the high PPI large-size transparent display product, although the market demand is large, there are still technical problems to be overcome.

In the related art, there are many indexes for evaluating a large-size high-PPI transparent display effect, including PPI, transparency, haze, clarity, etc. A transparent display device includes a plurality of pixels, and each pixel includes a transparent region and a display region. The larger the PPI, the smaller the pixel size, the larger the density of the metal wiring, and the smaller the area of the transparent area, so the transmittance may be adversely affected. In addition, a small hole diffraction effect may easily occur, and in actual use, such a phenomenon as ghost may occur for an object viewed through a transparent display screen, so the user experience may be adversely affected. Hence, currently there is an urgent need to reduce a diffraction ghost effect in the transparent display.

An object of the present disclosure is to provide a transparent display device, a simulation method for determining a pixel structure of the transparent display device, and a manufacturing method, so as to improve a diffraction ghost phenomenon.

As shown in FIG. 1, the present disclosure provides in some embodiments a transparent display device, which includes a base substrate 100 and a plurality of pixels arranged in an array form on the base substrate 100. Each pixel includes a transparent region 210 and a display region 220, and a scattering structure 300 for scattering light is provided along a boundary between the transparent region 210 and the display region 220.

According to the embodiments of the present disclosure, the scattering structure 300 having a scattering effect is arranged along the boundary between the transparent region 210 and the display region 220 without affecting the transparent region 210 (a pixel aperture) in the transparent display device, so as to form diffuse reflection, interfere with an optical path formed through pinhole diffraction, and attenuate a diffraction effect, thereby to improve the diffraction ghost phenomenon of the transparent display device.

It should be appreciated that, for the transparent display device in the embodiments of the present disclosure, although the haze increases to some extent, the diffraction ghost phenomenon is greatly improved. In actual use, a process may be adjusted to balance the haze, the diffraction and a display effect.

The transparent display device will be described hereinafter in more details.

As shown in FIG. 1, in some embodiments of the present disclosure, the scattering structure 300 includes a plurality of scattering point structures 310 spaced apart from each other along the boundary between the transparent region 210 and the display region 220.

During the implementation, the plurality of scattering point structures 310 is spaced apart from each other along the boundary between the transparent region 210 and the display region 220, so as to scatter light. A specific shape of the scattering point structure 310 will not be particularly defined herein. In some embodiments of the present disclosure, an orthogonal projection of the scattering point structure 310 onto the base substrate 100 has a circular, semicircular or rectangular shape, as long as the diffuse reflection occurs for the light and the diffraction phenomenon of the transparent region 210 is improved.

In addition, in a possible embodiment of the present disclosure, a scattering film layer is formed on the base substrate 100, and a plurality of scattering particle structures is distributed in the scattering film layer and forms the plurality of the scattering point structures 310.

Based on the above, the scattering point structure 310 is formed through patterning the scattering film layer. The scattering particle structures are also distributed in the scattering film layer, so as to further improve the scattering effect.

In some embodiments of the present disclosure, a portion of an orthogonal projection of the scattering film layer onto the base substrate 100 completely overlaps an orthogonal projection of the display region 220 onto the base substrate 100, i.e., the scattering film layer is completely arranged in the display region 220. In some other embodiments of the present disclosure, a portion of the orthogonal projection of the scattering film layer onto the base substrate 100 overlaps the orthogonal projection of the display region onto the base substrate 100, and the other portion of the orthogonal projection of the scattering film layer onto the base substrate 100 overlaps an orthogonal projection of the transparent region 210 onto the base substrate 100.

In addition, it should be further appreciated that, in the transparent display device, the display region 220 is provided with a display unit 110 including a plurality of film layers formed on the base substrate 100. For example, taking Active Matrix OLED (AMOLED) as an example, the display unit 110 includes films layers of a thin film transistor (TFT), a positive electrode, a negative electrode, an organic light-emitting unit, etc.

Figure 2:
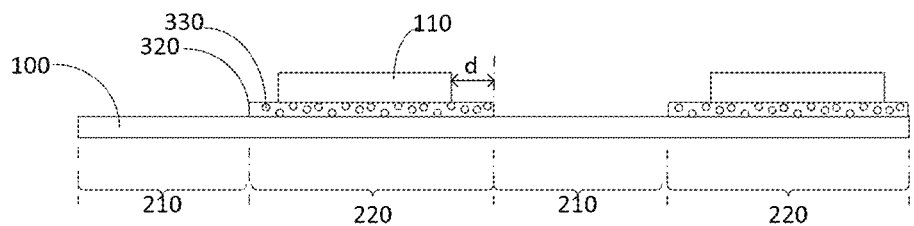
FIG. 2 is a partial sectional view of the transparent display device according to one embodiment of the present disclosure.
Figure 3:
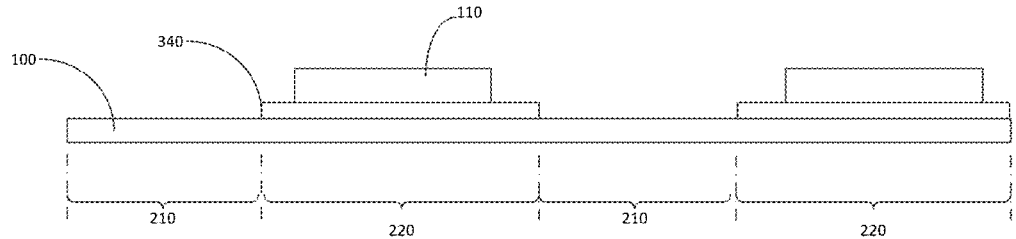
FIG. 3 is another partial sectional view of the transparent display device according to one embodiment of the present disclosure.

The scattering film layer is arranged between the display unit 110 and the base substrate 100 (as shown in FIGS. 2 and 3), or arranged on a side of the display unit 110 away from the base substrate 100, or separately arranged on an intermediate film layer of the display unit 110, or formed through a single patterning process with a light-transmitting film layer of the display unit 110. For example, the scattering film layer is made of a same material, and formed through a same patterning process, as the organic light-emitting unit.

In a possible embodiment of the present disclosure, as shown in FIG. 2, the scattering film layer includes an optical clear adhesive layer 320, and a plurality of scattering particles 330 is distributed in the optical clear adhesive layer 320 and forms the scattering particle structures.

Here, the scattering particles 330 are doped in the optical clear adhesive layer 320 to form the scattering particle structures. Then, the optical clear adhesive layer 320 in which the scattering particle structures are distributed is patterned so that scattering particle structures in the optical clear adhesive layer 320 form the plurality of the scattering point structures.

Based on the above, an optical clear adhesive layer 320 doped with scattering particles 330 is formed on the base substrate 100 of the transparent display device or a back plate with the display unit 110, and then patterned to form the scattering structure 300 along the boundary between the transparent region 210 and the display region 220. The optical clear adhesive layer 320 may be patterned through a photolithography process, which will be described hereinafter.

The optical clear adhesive layer 320 is coated on the base substrate 100 or the back plate with the display unit 110. The optical clear adhesive layer 320 is a photoresist doped with the scattering particles 330. Next, the photoresist is exposed with a mask, so as to form a photoresist reserved region corresponding to a region where a pattern of the scattering film layer is located and a photoresist unreserved region corresponding to the other region. Next, the photoresist is developed, so as to fully remove the photoresist at the photoresist unreserved region and maintain a thickness of the photoresist at the photoresist reserved region. Then, the optical clear adhesive layer 320 at the photoresist unreserved region is fully etched off through an etching process, and the remaining photoresist is removed, so as to form the pattern of the scattering film layer.

In some embodiments of the present disclosure, the scattering film layer has a thickness of about 3.0 µm, and a width d of the scattering point structure 310 in a direction perpendicular to the boundary and parallel to the base substrate 100 is 0.5 µm-1.0 µm. At this time, through the scattering point structure 310, it is able to increase an amount of scattered light, and reduce the diffraction ghost phenomenon of the transparent display device without affecting the transparent region 210.

Of course, it should be appreciated that, the thickness of the scattering film layer and the width of the scattering point structure 310 may not be limited to those mentioned hereinabove, and in actual use, they may be adjusted appropriately.

In addition, in some embodiments of the present disclosure, the scattering particles 330 are quantum dot particles which are difficult to be excited under natural light, so as to prevent the display effect from being adversely affected. In addition, for some transparent display devices, the display unit 110 at the display region 220 includes a quantum dot light-emitting unit. The scattering film layer and the light-emitting unit having quantum dots are formed through a single patterning process, so as to simplify the manufacture process. Of course, it should be appreciated that, the scattering particles 330 may also be any other particles having a scattering effect.

In addition, in some other embodiments of the present disclosure, as shown in FIG. 3, the scattering film layer includes a transparent thin film layer 340 having a surface in a discontinuous crystalline form, a discontinuous crystalline structure at the surface of the transparent thin film layer 340 forms the scattering particle structure, and a refractive index of the transparent thin film layer 340 is greater than a refractive index of the base substrate 100.

Based on the above, the scattering film layer is formed using the discontinuous crystallinity of the transparent thin film layer 340. The transparent thin film layer 340 is an indium tin oxide (ITO) thin film. The transparent thin film layer 340 has a thickness of 80 Å to 120 Å in a direction perpendicular to the base substrate 100.

Figure 4:
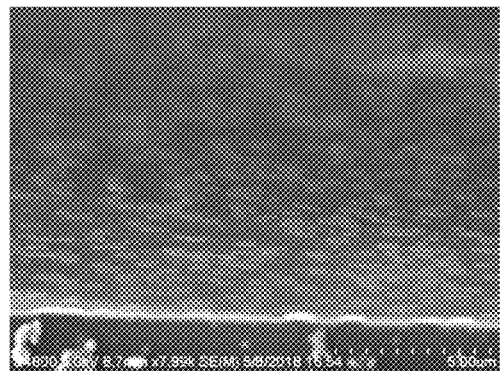
FIG. 4 is a graph of discontinuous crystallization at an ITO surface.
Figure 5:
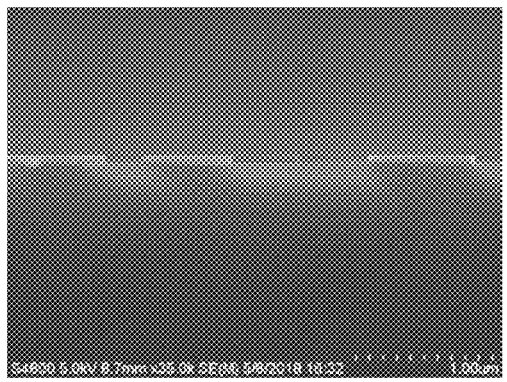
FIG. 5 is a graph of a cross section of discontinuous crystalline of a micron-level ITO film.
Figure 6:
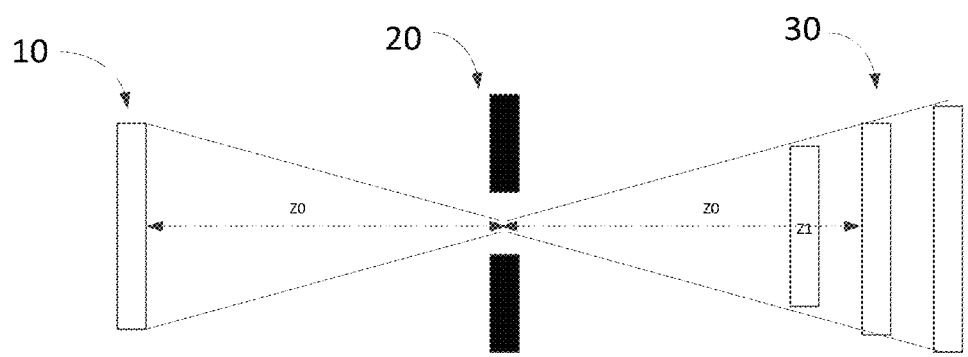
FIG. 6 is a graph of an optical path for a simulation model in a simulation method according to one embodiment of the present disclosure.
Figure 7:
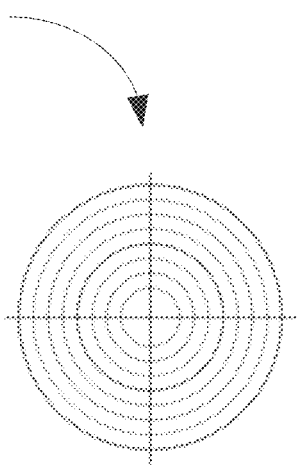
FIG. 7 is a schematic view showing an original image for the simulation model in the simulation method according to one embodiment of the present disclosure.
Figure 8:
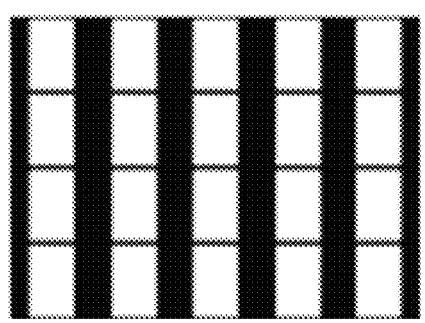
FIG. 8 is a schematic view showing a pixel simulation member of the simulation model in the simulation method according to one embodiment of the present disclosure.
Figure 9:
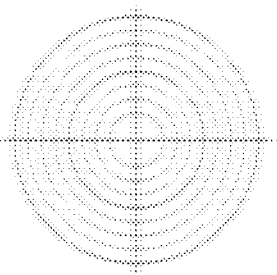
FIG. 9 is a schematic view showing a diffraction effect image for the simulation model in the simulation method according to one embodiment of the present disclosure.

FIGS. 4-5 show scanning electron microscope (SEM) images of 100A ITO thin film deposited after an annealing process. FIG. 4 shows the discontinuous crystallization at a surface of the ITO thin film, and FIG. 5 shows the cross section of the discontinuous crystallization of the micron-level ITO thin film. For such ITO thin film having a surface with discontinuous crystallization, its refractive index is greater than that of the base substrate 100, so the amount of light scattered at an edge of the transparent region 210 may increase, and thereby the diffraction ghost phenomenon may be improved. In addition, through the transparent thin film layer 340, it is also able to improve the back reflection of the transparent display device.

Taking ITO as an example, the transparent thin film layer 340 may be manufactured as follows.

The ITO thin film having a thickness of about 80 angstroms-120 angstroms is deposited on the base substrate 100 or the back plate with the display unit 110, and then patterned through an etching process. Next, the ITO thin film is annealed at a predetermined temperature to form the scattering film layer with discontinuous crystalline. The predetermined temperature may be 250° C.±50° C. In a possible embodiment of the present disclosure, the predetermined temperature may be 200° C., 250° C., or 300° C.

It should be appreciated that, as mentioned above, the transparent thin film layer 340 is the ITO thin film having a surface in a discontinuous crystalline form, and it may be deposited while forming the other ITO layers. However, the transparent thin film layer 340 may be made of any other appropriate material in addition to ITO.

It should be appreciated that, the transparent display device in the embodiments of the present disclosure refers to a display substrate of a transparent display product, or an entire display module, or an entire display device.

In the transparent display device, two important indicators for evaluating a large-size high PPI transparent display effect include transparency and whether there is light distortion, both of which are related to such parameters as PPI, pixel structure, and arrangement mode. The light distortion is mainly caused by optical diffraction. When a light wave encounters an obstacle (aperture), it may deviate from a straight line, and this phenomenon is called as light diffraction. The smaller the aperture, the larger the diffraction range, the wider the diffraction fringe and the smaller the brightness value. Coherent light superposition meets the principle of complex amplitude superposition, a light intensity is a square of a complex amplitude, a phase of incoherent light changes irregularly, and a total light intensity is a sum of intensities of various beams. In the transparent display product, the rule of incoherent light is met in most cases.

The present disclosure further provides in some embodiments a simulation method for determining a pixel structure of a transparent display device. Through building a transparent display simulation model and taking such parameters as PPI and haze into consideration, a diffraction effect image of designed pixels is obtained for quantitative evaluation, so as to obtain a pixel design rule and an optimal scheme for the transparent display, thereby to improve the diffraction ghost phenomenon.

The simulation method in the embodiments of the present disclosure includes the following steps.

Step S01: establishing a simulation model. As shown in FIGS. 6 to 9, the simulation model includes an original image generation member for displaying an original image 10, a pixel simulation member 20 for simulating the pixel structure of the transparent display device, and a diffraction effect image generation member for displaying a diffraction effect image 30.

The pixel simulation member 20 is configured to simulate the pixel structure of the transparent display device, and it may select a same aperture plane as a pixel structure design of the transparent display device.

Step S02: adjusting a pixel structure parameter of the pixel simulation member 20 in the simulation model so as to obtain the diffraction effect images 30 corresponding to the original image 10 with different pixel structure parameters.

Step S03: determining a difference coefficient E of images before and after the diffraction in accordance with the original image 10 and the diffraction effect image 30, so as to obtain a correspondence between different pixel structure parameters and the difference coefficient E of the images before and after the diffraction as a quantitative evaluation result.

Step S04: determining optimized pixel structure data of the transparent display device in accordance with the quantitative evaluation result.

In the above-mentioned method, the transparent display simulation model is established, the original image 10 is taken as an object, an aperture plane is designed in accordance with the pixel structure of the transparent display device, the diffraction effect image 30 corresponding to the different pixel structure parameters is obtained through simulation, and the difference coefficient E of the two images before and after diffraction so as to obtain the quantitative evaluation result. The smaller the value of E, the less the diffraction effect, and the better the photographing effect of the transparent display or an under-screen camera. As a result, it is able to obtain a pixel design rule and an optimal scheme for the transparent display, thereby to improve the diffraction ghost phenomenon.

In some embodiments of the present disclosure, the determining the difference coefficient E of the image before and after the diffraction in accordance with the original image and the diffraction effect image includes calculating the difference coefficient E through formulae: E1=an average brightness value of sub-pixels in the original image—an average brightness value of sub-pixels in the diffraction effect image (1), E2=$\overline{|E1|}$3*std2(E1) (2), E3=(0.3*E21+0.6*E22+0.1*E23)*255 (3), and E=E3/E30 (4), where $\overline{|E1|}$ is an average value of absolute values of E1, std2 (E1) is a mean square deviation of E1, each pixel includes a first sub-pixel, a second sub-pixel, and a third sub-pixel, E21, E22 and E23 are values of E2 obtained with respect to the first sub-pixel, the second sub-pixel and the third sub-pixel respectively, and E30 is a value of E3 calculated through formulae (1), (2) and (3) when the average brightness value of the sub-pixels in the diffraction effect image in formula (1) is zero.

In some embodiments of the present disclosure, each pixel includes a first sub-pixel, a second sub-pixel, and a third sub-pixel, such as a red (R) sub-pixel, a green (G) sub-pixel, and a blue (B) sub-pixel. The values of E1 and E2 are calculated for the RGB sub-pixels, and a weighted average value of the values of E3 for the RGB sub-pixels, namely E3, is calculated. E30 is a value of E3 calculated through formulae (1), (2), and (3) when the sub-pixel average brightness value of the diffraction effect image in formula (1) is zero.

The pixel structure parameter at least includes a pixel aperture ratio parameter, a haze parameter and a structural shape parameter (namely, an aperture structural shape) of each of the transparent region 210 and the display region 220 in a pixel, and the pixel structure parameter of the pixel simulation member 20 is adjusted in a single variable adjustment manner.

In other words, when obtaining the correspondence between a certain pixel structure parameter and the difference coefficient E of the images before and after diffraction, the other pixel structure parameters are unchanged and only the pixel structure parameter is adjusted. For example, when obtaining the correspondence between the pixel aperture ratio parameter and the difference coefficient E of the images before and after diffraction, only the pixel aperture ratio parameter of the simulation member is changed, and the other pixel structure parameters (e.g., the haze, and the structural shape parameter of each of the transparent region 210 and the display region 220 in the pixel) remain unchanged.

The implementation of the above-mentioned simulation method will be illustratively described hereinafter.

Figure 10:
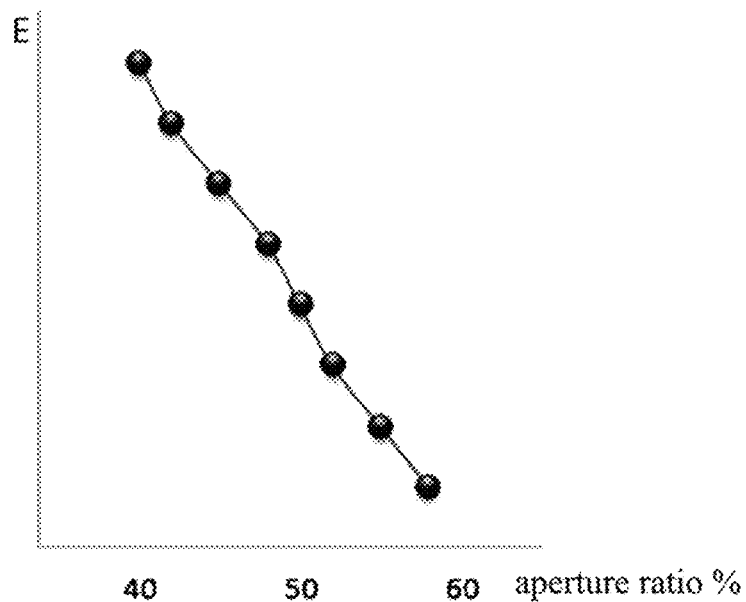
FIG. 10 is a curve diagram showing a correspondence between a pixel aperture ratio parameter and a value of E obtained in the simulation method according to one embodiment of the present disclosure.

At first, the pixel aperture ratio parameter of the simulation member is adjusted. For example, the pixel aperture ratio is increased sequentially, so as to obtain the diffraction effect images 30 corresponding to different pixel aperture ratio parameters, and calculate the difference coefficient E of the images before and after diffraction. FIG. 10 shows a curve of the correspondence between the pixel aperture ratio parameter (x-axis) and the value of E (y-axis), and this curve may serve as the quantitative evaluation result. As shown in FIG. 10, the value of E decreases along with an increase in the pixel aperture ratio, so an optimal aperture ratio scheme may be obtained in accordance with the requirement on the PPI.

Figure 11:
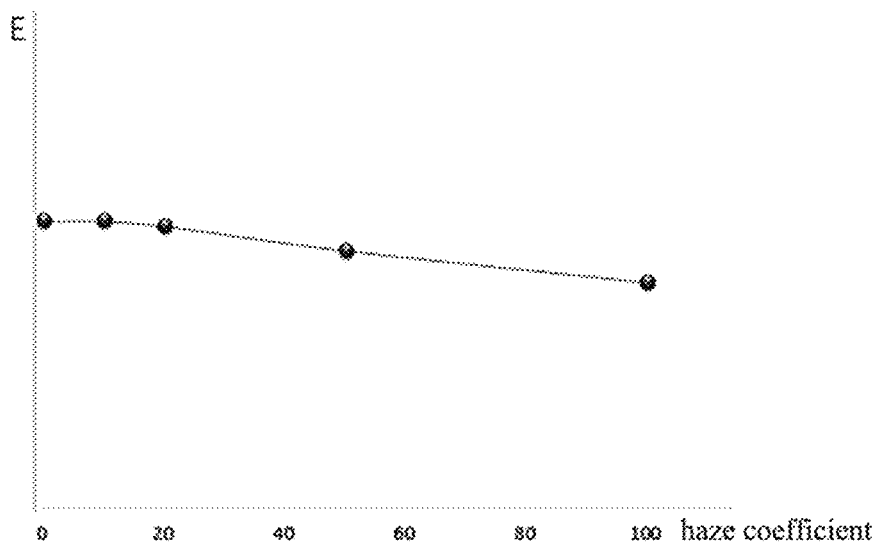
FIG. 11 is a curve diagram showing a correspondence between a haze parameter and the value of E obtained in the simulation method according to one embodiment of the present disclosure.

Next, the haze parameter of the simulation member is adjusted, so as to obtain the diffraction effect images 30 corresponding to different haze parameters, and calculate the difference coefficient E of the images before and after diffraction. FIG. 11 shows a curve of the correspondence between the haze parameter (x-axis) and the value of E (y-axis), and this curve may serve as the quantitative evaluation result. As shown in FIG. 11, the value of E decreases along with an increase in the haze parameter, so an optimal haze scheme may be obtained in accordance with the requirement on the light transmittance of the transparent display device.

Figure 12:
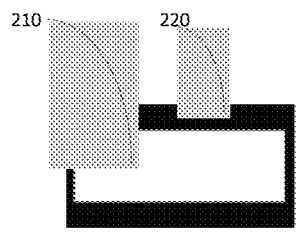
FIGS. 12-14 are schematic views showing several structural shapes of a transparent region and a display region in a pixel in the simulation method according to one embodiment of the present disclosure.
Figure 13:
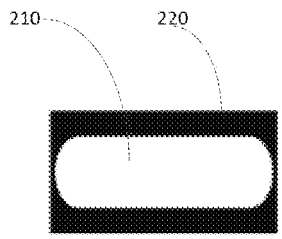
Figure 14:
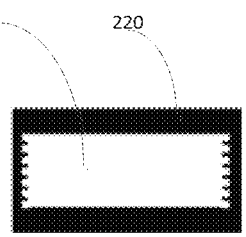

Then, the structural shape parameter of each of the transparent region 210 and the display region 220 in the pixel is adjusted in the simulation member, so as to obtain the diffraction effect images 30 corresponding to the structural shape parameter of each of the transparent region 210 and the display region 220 in different pixels, and calculate the difference coefficient E of the images before and after the diffraction. An optimal design scheme of the structural shape of each of the transparent region 210 and the display region 220 in the pixel may be selected in accordance with the value of E and the diffraction effect image 30 corresponding to the structural shape parameters of the transparent region 210 and the display region 220 in different pixels. It should be appreciated that, the structural shape parameters of the transparent region 210 and the display region 220 in the pixel include an extension direction of the transparent region 210 in the pixel, a shape of the transparent region 210, etc. FIGS. 12 to 14 show the optimized pixel structure of the transparent display device obtained through the simulation method in the embodiments of the present disclosure. For example, the transparent region 210 in the pixel in FIG. 12 is a rectangle, the transparent region 210 in the pixel in FIG. 13 is a strip with circular arcs at both ends, and a part of the transparent region 210 in the pixel in FIG. 14 has a jagged boundary.

Of course, it should be appreciated that, the above-mentioned is merely for illustrative purposes, and in actual use, the optimum pixel structure parameters of the transparent display device may be determined through the simulation method in accordance with the structure of the transparent display device.

The present disclosure further provides in some embodiments a method for manufacturing the transparent display device, which includes: S1 of forming a plurality of pixels arranged in an array form on the base substrate 100, each pixel including the transparent region 210 and the display region 220; and S2 of forming the scattering structure 300 for scattering light along a boundary between the transparent region 210 and the display region 220.

According to the embodiments of the present disclosure, the scattering structure 300 having a scattering effect is arranged along the boundary between the transparent region 210 and the display region 220 without affecting the transparent region 210 (a pixel aperture) in the transparent display device, so as to form diffuse reflection, interfere with an optical path formed through pinhole diffraction, and attenuate a diffraction effect, thereby to improve the diffraction ghost phenomenon of the transparent display device.

In some embodiments of the present disclosure, the scattering structure 300 includes a plurality of scattering point structures 310 spaced apart from each other along the boundary between the transparent region 210 and the display region 220. S2 specifically includes coating the optical clear adhesive layer 320 doped with scattering particles 330 on the base substrate 100, and patterning the optical clear adhesive layer 320 to form the plurality of scattering point structures 310 spaced apart from each other along the boundary between the transparent region 210 and the display region 220.

Based on the above, the optical clear adhesive layer 320 doped with scattering particles 330 is formed on the base substrate 100 of the transparent display device or a back plate with the display unit 110, and then patterned to form the scattering structure 300 along the boundary between the transparent region 210 and the display region 220. The optical clear adhesive layer 320 may be patterned through a photolithography process, which will be described hereinafter.

The optical clear adhesive layer 320 is coated on the base substrate 100 or the back plate with the display unit 110. The optical clear adhesive layer 320 is a photoresist doped with the scattering particles 330. Next, the photoresist is exposed with a mask, so as to form a photoresist reserved region corresponding to a region where a pattern of the scattering film layer is located and a photoresist unreserved region corresponding to the other region. Next, the photoresist is developed, so as to fully remove the photoresist at the photoresist unreserved region and maintain a thickness of the photoresist at the photoresist reserved region. Then, the optical clear adhesive layer 320 at the photoresist unreserved region is fully etched off through an etching process, and the remaining photoresist is removed, so as to form the pattern of the scattering film layer.

In some embodiments of the present disclosure, the scattering film layer has a thickness of about 3.0 µm, and a width d of the scattering point structure 310 in a direction perpendicular to the boundary and parallel to the base substrate 100 is 0.5 µm-1.0 µm. At this time, through the scattering point structure 310, it is able to increase an amount of scattered light, and reduce the diffraction ghost phenomenon of the transparent display device without affecting the transparent region 210.

Of course, it should be appreciated that, the thickness of the scattering film layer and the width of the scattering point structure 310 may not be limited to those mentioned hereinabove, and in actual use, they may be adjusted appropriately.

In addition, in some embodiments of the present disclosure, the scattering particles 330 are quantum dot particles which are difficult to be excited under natural light, so as to prevent the display effect from being adversely affected. In addition, for some transparent display devices, the display unit 110 at the display region 220 includes a quantum dot light-emitting unit. The scattering film layer and the light-emitting unit having quantum dots are formed through a single patterning process, so as to simplify the manufacture process. Of course, it should be appreciated that, the scattering particles 330 may also be any other particles having a scattering effect.

In addition, in some other embodiments of the present disclosure, as shown in FIG. 3, the scattering film layer includes a transparent thin film layer 340 having a surface in a discontinuous crystalline form, a discontinuous crystalline structure at the surface of the transparent thin film layer 340 forms the scattering particle structure, and a refractive index of the transparent thin film layer 340 is greater than a refractive index of the base substrate 100.

Based on the above, the scattering film layer is formed using the discontinuous crystallinity of the transparent thin film layer 340. The transparent thin film layer 340 is an indium tin oxide (ITO) thin film. The transparent thin film layer 340 has a thickness of 80 Å to 120 Å in a direction perpendicular to the base substrate 100. For such ITO thin film having a surface with discontinuous crystallization, its refractive index is greater than that of the base substrate 100, so the amount of light scattered at an edge of the transparent region 210 may increase, and thereby the diffraction ghost phenomenon may be improved. In addition, through the transparent thin film layer 340, it is also able to improve the back reflection of the transparent display device.

Taking ITO as an example, the transparent thin film layer 340 may be manufactured as follows.

An ITO thin film having a thickness of about 80 angstroms-120 angstroms is formed on the base substrate 100 or the back plate with the display unit 110 through sputtering, patterned, and then annealed at a predetermined temperature to form the scattering film layer in a discontinuous crystalline form. The predetermined temperature may be 250° C.±50° C.

The transparent thin film layer 340 may be patterned as follows.

At first, a photoresist is coated on the transparent thin film layer 340 deposited on the base substrate 100. Next, the photoresist is exposed with a mask, so as to form a photoresist reserved region corresponding to a region where a pattern of the scattering structure 300 is located and a photoresist unreserved region corresponding to the other region. Next, the photoresist is developed, so as to fully remove the photoresist at the photoresist unreserved region and maintain a thickness of the photoresist at the photoresist reserved region. Then, the transparent thin film at the photoresist unreserved region is fully etched off through an etching process, and the remaining photoresist is removed, so as to form the pattern of the scattering structure 300.

It should be appreciated that, the transparent thin film layer 340 may be an ITO layer, the display unit 110 in the transparent display device includes an ITO layer, and the transparent thin film layer 340 may be formed through a single patterning process as the ITO layer in the display unit 110, so as to simplify the manufacture process.

In addition, in some embodiments of the present disclosure, prior to forming the plurality of pixels arranged in an array form on the base substrate 100, the method further includes determining optimized pixel structure data of the transparent display device through the above-mentioned simulation method, and the forming the plurality of pixels arranged in an array form on the base substrate includes forming the plurality of pixels arranged in an array form on the base substrate 100 in accordance with the optimized pixel structure data.

Through building a transparent display simulation model and taking such parameters as PPI and haze into consideration, the diffraction effect image 30 of designed pixels is obtained for quantitative evaluation, so as to obtain a pixel design rule and an optimal scheme for the transparent display, thereby to improve the diffraction ghost phenomenon.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A transparent display device, comprising a base substrate and a plurality of pixels arranged in an array form on the base substrate, wherein each pixel comprises a transparent region and a display region, and a scattering structure for scattering light is arranged along a boundary between the transparent region and the display region;
   wherein the scattering structure comprises a plurality of scattering point structures spaced apart from each other along the boundary between the transparent region and the display region;
   wherein the transparent display device further comprises a scattering film layer on the base substrate, wherein a plurality of scattering particle structures is distributed in the scattering film layer, and the plurality of scattering particle structures forms the plurality of the scattering point structures;
   wherein the display region is provided with a display unit, and the scattering film layer is provided between the display unit and the base substrate.

2. The transparent display device according to claim 1, wherein the scattering film layer comprises an optical clear adhesive layer, and a plurality of scattering particles is distributed in the optical clear adhesive layer and forms the scattering particle structures.

3. The transparent display device according to claim 2, wherein the scattering particles comprise quantum dot particles.

4. The transparent display device according to claim 1, wherein the scattering film layer comprises a transparent thin film layer having a surface in a discontinuous crystalline form, a discontinuous crystalline structure at the surface of the transparent thin film layer forms the scattering particle structure, and a refractive index of the transparent thin film layer is greater than a refractive index of the base substrate.

5. The transparent display device according to claim 4, wherein the transparent film layer comprises an indium tin oxide thin film.

6. The transparent display device according to claim 4, wherein the transparent thin film layer has a thickness of 80 angstroms to 120 angstroms in a direction perpendicular to the base substrate.

7. The transparent display device according to claim 1, wherein a width of the scattering point structure in a direction perpendicular to the boundary and parallel to the base substrate is 0.5 micrometers to 1.0 micrometers.

8. The transparent display device according to claim 1, wherein a portion of an orthogonal projection of the scattering film layer onto the base substrate overlaps an orthogonal projection of the display region onto the base substrate, and the other portion of the orthogonal projection of the scattering film layer onto the base substrate overlaps an orthogonal projection of the transparent region onto the base substrate.

9. The transparent display device according to claim 1, wherein the orthogonal projection of the scattering film layer onto the base substrate completely overlaps the orthogonal projection of the display region onto the base substrate.

10. A method for manufacturing the transparent display device according to claim 1, comprising:
    forming a plurality of pixels arranged in an array form on the base substrate, each pixel comprising a transparent region and a display region; and
    forming a scattering structure for scattering light along a boundary between the transparent region and the display region.

11. The method according to claim 10, wherein prior to forming the plurality of pixels arranged in an array form on the base substrate, the method further comprises determining optimized pixel structure data of the transparent display device through a simulation method, and the forming the plurality of pixels arranged in an array form on the base substrate comprises forming the plurality of pixels arranged in an array form on the base substrate in accordance with the optimized pixel structure data;
    wherein the simulation method comprises:
    establishing a simulation model, the simulation model comprising an original image generation member for displaying an original image, a pixel simulation member for simulating the pixel structure of the transparent display device, and a diffraction effect image generation member for displaying a diffraction effect image;
    adjusting a pixel structure parameter of the pixel simulation member in the simulation model so as to obtain diffraction effect images corresponding to the original image with different pixel structure parameters;
    determining a difference coefficient E of an image before and after the diffraction in accordance with the original image and the diffraction effect image, so as to obtain a correspondence between different pixel structure parameters and the difference coefficient E of the image before and after the diffraction as a quantitative evaluation result; and
    determining optimized pixel structure data of the transparent display device in accordance with the quantitative evaluation result,
    wherein the determining the difference coefficient E of the images before and after the diffraction in accordance with the original image and the diffraction effect image comprises calculating the difference coefficient E through formulae: E1=an average brightness value of sub-pixels in the original image−an average brightness value of sub-pixels in the diffraction effect image (1), E2=$\overline{|E1|}$+3*std2 (E1) (2), E3=(0.3*E21+0.6*E22+0.1*E23)*255 (3), and E=E3/E30 (4), where $\overline{|E1|}$ is an average value of absolute values of E1, std2 (E1) is a mean square deviation of E1, each pixel comprises a first sub-pixel, a second sub-pixel, and a third sub-pixel, E21, E22 and E23 are values of E2 obtained with respect to the first sub-pixel, the second sub-pixel and the third sub-pixel respectively, and E30 is a value of E3 calculated through formulae (1), (2) and (3) when the average brightness value of the sub-pixels in the diffraction effect image in formula (1) is zero, wherein the adjusting the pixel structure parameter of the pixel simulation member in the simulation model so as to obtain the diffraction effect images corresponding to the original image with different pixel structure parameters specifically comprises adjusting the pixel structure parameter of the pixel simulation member in a single variable adjustment manner, and the pixel structure parameter at least comprises a pixel aperture ratio parameter, a haze parameter, and a structural shape parameter of each of the transparent region and the display region in a pixel;

wherein the transparent display device comprises a base substrate and a plurality of pixels arranged in an array form on the base substrate, wherein each pixel comprises a transparent region and a display region, and a scattering structure for scattering light is arranged along a boundary between the transparent region and the display region;

wherein the scattering structure comprises a plurality of scattering point structures spaced apart from each other along the boundary between the transparent region and the display region;

wherein the transparent display device further comprises a scattering film layer on the base substrate, wherein a plurality of scattering particle structures is distributed in the scattering film layer, and the plurality of scattering particle structures forms the plurality of the scattering point structures;

wherein the display region is provided with a display unit, and the scattering film layer is provided between the display unit and the base substrate.

12. The method according to claim 10, wherein the scattering structure comprises a plurality of scattering point structures spaced apart from each other along the boundary between the transparent region and the display region, and the forming the scattering structure for scattering light along the boundary between the transparent region and the display region comprises coating an optical clear adhesive layer doped with scattering particles on the base substrate, and patterning the optical clear adhesive layer to form the plurality of scattering point structures spaced apart from each other along the boundary between the transparent region and the display region, wherein the scattering point structure comprises quantum dot particles, and the display region comprises a quantum dot light-emitting unit, wherein the forming the scattering structure for scattering light along the boundary between the transparent region and the display region comprises forming the optical clear adhesive layer and the quantum dot light-emitting unit simultaneously through a single patterning process.

13. The method according to claim 10, wherein the scattering structure comprises a plurality of scattering point structures spaced apart from each other along the boundary between the transparent region and the display region, wherein the forming the scattering structure for scattering light along the boundary between the transparent region and the display region comprises depositing a transparent thin film on the base substrate, patterning the transparent thin film, and annealing the transparent thin film at a predetermined temperature to form a transparent thin film layer with a surface in a discontinuous crystalline form, and wherein a refractive index of the transparent thin film layer is greater than a refractive index of the base substrate, and a discontinuous crystalline structure in the transparent thin film layer forms the scattering point structure.

14. A simulation method for determining a pixel structure of a transparent display device, comprising:

establishing a simulation model, the simulation model comprising an original image generation member for displaying an original image, a pixel simulation member for simulating the pixel structure of the transparent display device, and a diffraction effect image generation member for displaying a diffraction effect image;

adjusting a pixel structure parameter of the pixel simulation member in the simulation model so as to obtain diffraction effect images corresponding to the original image with different pixel structure parameters;

determining a difference coefficient E of an image before and after the diffraction in accordance with the original image and the diffraction effect image, so as to obtain a correspondence between different pixel structure parameters and the difference coefficient E of the image before and after the diffraction as a quantitative evaluation result; and determining optimized pixel structure data of the transparent display device in accordance with the quantitative evaluation result, wherein the determining the difference coefficient E of the images before and after the diffraction in accordance with the original image and the diffraction effect image comprises calculating the difference coefficient E through formulae: E1=an average brightness value of sub-pixels in the original image−an average brightness value of sub-pixels in the diffraction effect image (1), E2=$\overline{|E1|}$+3*std2 (E1) (2), E3=(0.3*E21+0.6*E22+0.1*E23)*255 (3), and E=E3/E30 (4), where $\overline{|E1|}$ is an average value of absolute values of E1, std2 (E1) is a mean square deviation of E1, each pixel comprises a first sub-pixel, a second sub-pixel, and a third sub-pixel, E21, E22 and E23 are values of E2 obtained with respect to the first sub-pixel, the second sub-pixel and the third sub-pixel respectively, and E30 is a value of E3 calculated through formulae (1), (2) and (3) when the average brightness value of the sub-pixels in the diffraction effect image in formula (1) is zero, wherein the adjusting the pixel structure parameter of the pixel simulation member in the simulation model so as to obtain the diffraction effect images corresponding to the original image with different pixel structure parameters specifically comprises adjusting the pixel structure parameter of the pixel simulation member in a single variable adjustment manner, and the pixel structure parameter at least comprises a pixel aperture ratio parameter, a haze parameter, and a structural shape parameter of each of the transparent region and the display region in a pixel;

wherein the transparent display device comprises a base substrate and a plurality of pixels arranged in an array form on the base substrate, wherein each pixel comprises a transparent region and a display region, and a scattering structure for scattering light is arranged along a boundary between the transparent region and the display region;

wherein the scattering structure comprises a plurality of scattering point structures spaced apart from each other along the boundary between the transparent region and the display region;

wherein the transparent display device further comprises a scattering film layer on the base substrate, wherein a plurality of scattering particle structures is distributed in the scattering film layer, and the plurality of scattering particle structures forms the plurality of the scattering point structures;

wherein the display region is provided with a display unit, and the scattering film layer is provided between the display unit and the base substrate.

\* \* \* \* \*